(12) United States Patent
Yeh et al.

(10) Patent No.: US 12,198,770 B2
(45) Date of Patent: Jan. 14, 2025

(54) MEMORY DEVICE FOR INCREASING SPEED OF SOFT-PROGRAM OPERATION

(71) Applicant: MACRONIX International Co., Ltd., Hsinchu (TW)

(72) Inventors: Teng-Hao Yeh, Hsinchu County (TW); Hang-Ting Lue, Hsinchu (TW); Tzu-Hsuan Hsu, Chiayi County (TW); Chen-Huan Chen, Hsinchu County (TW); Ken-Hui Chen, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 209 days.

(21) Appl. No.: 17/988,773

(22) Filed: Nov. 17, 2022

(65) Prior Publication Data
US 2024/0170076 A1   May 23, 2024

(51) Int. Cl.
| | | |
|---|---|---|
| *G11C 16/06* | (2006.01) | |
| *G11C 7/10* | (2006.01) | |
| *G11C 16/08* | (2006.01) | |
| *G11C 16/24* | (2006.01) | |
| *G11C 16/34* | (2006.01) | |

(52) U.S. Cl.
CPC ........ *G11C 16/3459* (2013.01); *G11C 7/1039* (2013.01); *G11C 16/08* (2013.01); *G11C 16/24* (2013.01)

(58) Field of Classification Search
CPC .................................................. G11C 16/3459
USPC ..................................................... 365/185.22
See application file for complete search history.

(56) References Cited

U.S. PATENT DOCUMENTS

| | | | |
|---|---|---|---|
| 7,075,821 B2 | 7/2006 | Ye et al. | |
| 9,704,585 B2* | 7/2017 | Georgescu | G11C 7/18 |
| 2009/0154252 A1* | 6/2009 | Shibata | G11C 16/14 |
| | | | 365/185.29 |
| 2012/0307565 A1* | 12/2012 | Aritome | G11C 16/0483 |
| | | | 365/185.33 |

(Continued)

FOREIGN PATENT DOCUMENTS

| | | |
|---|---|---|
| CN | 1462074 | 12/2003 |
| CN | 104217749 | 7/2017 |
| JP | H11176180 | 7/1999 |

(Continued)

OTHER PUBLICATIONS

"Office Action of Japan Counterpart Application", issued on Jan. 9, 2024, pp. 1-2.

(Continued)

*Primary Examiner* — Hoai V Ho
(74) *Attorney, Agent, or Firm* — J.C. PATENTS

(57) ABSTRACT

A memory device, such as a 3D AND flash memory, includes a memory cell block, a word line driver, and a plurality of bit line switches. The word line driver has a plurality of complementary transistor pairs for respectively generating a plurality of word line signals for a plurality of word lines. Substrates of a first transistor and a second transistor of each of the complementary transistor pairs respectively receive a first voltage and a second voltage. Each of the bit line switches includes a third transistor. A substrate of the third transistor receives a third voltage. The first voltage, the second voltage, and the third voltage are constant static voltages during a soft program operation and a soft program verify operation.

16 Claims, 12 Drawing Sheets

(56) References Cited

U.S. PATENT DOCUMENTS

2021/0241081 A1* 8/2021 Sung .................. G06N 3/049

FOREIGN PATENT DOCUMENTS

| JP | 2007102923 | 4/2007 |
|----|------------|--------|
| JP | 2009146521 | 7/2009 |
| TW | 279984 | 7/1996 |
| TW | 425559 | 3/2001 |
| TW | I222647 | 10/2004 |

OTHER PUBLICATIONS

"Office Action of Taiwan Counterpart Application", issued on Nov. 30, 2023, pp. 1-4.

* cited by examiner

MEMORY DEVICE FOR INCREASING SPEED OF SOFT-PROGRAM OPERATION

BACKGROUND

Technical Field

The disclosure relates to a memory device. In particular, the disclosure relates to a memory device that can speed up a soft program operation.

Description of Related Art

Generally, in a first-stage decoding circuit in a three-dimensional memory device, since substrates of transistors share large-area well regions, a number of parasitic capacitances are generated between the well regions and a substrate of a wafer. For these parasitic circuits, switching operations on voltages on the substrates of the transistors are required to be performed alternately for different voltages required by individual operations during a soft program operation and a soft program verify operation performed by the memory device. Based on the voltage switching operations, the soft program operation and the soft program verify operation of the memory device require additional stabilization time for the voltage on the substrate of the transistor. Therefore, the time of the soft program operation and the soft program verify operation of the memory device will be prolonged, reducing work efficiency of the memory device. Moreover, repeated charging and discharging of the parasitic circuits also causes unnecessary power consumption, reducing work efficiency of the memory device.

SUMMARY

The disclosure provides a memory device, such as a three-dimensional AND memory device, which can increase a speed of performing a soft program operation.

The memory device of an embodiment of the disclosure includes a memory cell block, a word line driver, and a plurality of bit line switches. The word line driver has a plurality of complementary transistor pairs for respectively generating a plurality of word line signals for a plurality of word lines of the memory cell block. Substrates of a first transistor and a second transistor of each of the complementary transistor pairs respectively receive a first voltage and a second voltage. The plurality of bit line switches are respectively coupled to a plurality of bit lines of the memory cell block. Each of the bit line switches includes a third transistor. A substrate of the third transistor receives a third voltage. The first voltage, the second voltage, and the third voltage are maintained to be constant static voltages during a soft program operation and a soft program verify operation performed by the memory cell block.

Based on the foregoing, in the memory device of the embodiments of the disclosure, the voltages received by the substrates of the transistors in the word line driver and in the bit line switches are maintained to be constant static voltages during the soft program operation and the soft program verify operation. As a result, during the soft program operation and the soft program verify operation, voltage stabilization time required by the transistors in the word line driver and in the bit line switches for repeatedly switching the substrate voltages may be omitted, which can effectively increase the speed of performing the soft program operation and the soft program verify operation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
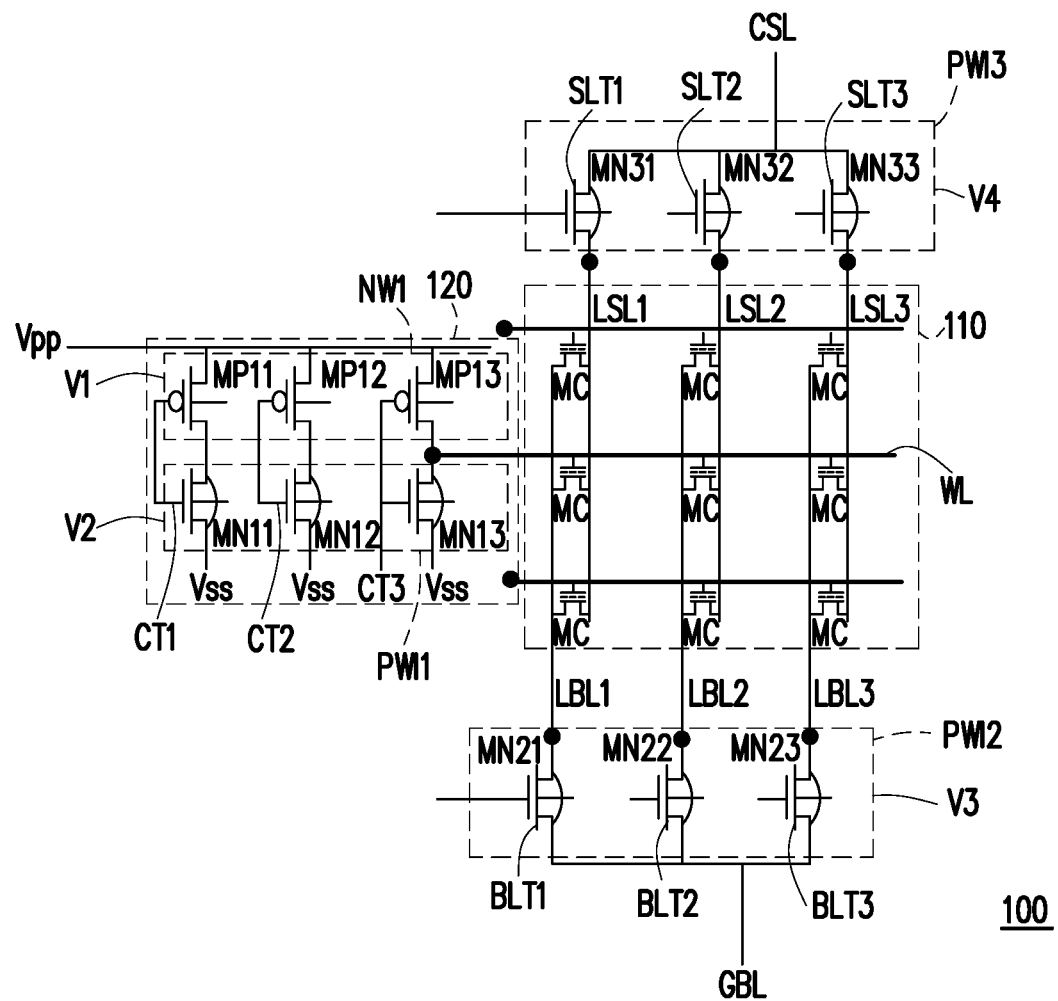
FIG. 1 is a schematic diagram of a memory device according to an embodiment of the disclosure.

With reference to FIG. 1, FIG. 1 is a schematic diagram of a memory device according to an embodiment of the disclosure. A memory device 100 includes a memory cell block 110, a word line driver 120, a plurality of bit line switches BLT1 to BLT3, and a plurality of source line switches SLT1 to SLT3. The word line driver 120 is coupled to a word line WL on the memory cell block 110. The word line driver 120 includes a plurality of transistors MP11 to MP13 and MN11 to MN13. The transistors MP1 to MP13 are P-type transistors, and the transistors MN11 to MN13 are N-type transistors. The transistors MP11 to MP13 and the transistors MN11 to MN13 respectively form a plurality of complementary transistor pairs, and are respectively controlled by control signals CT1 to CT3.

In this embodiment, substrates of the transistors MP11 to MP13 may be formed by an N-type well region NW1, and substrates of the transistors MN11 to MN13 may be formed by a P-type well region PWI1. The substrates of the transistors MP11 to MP13 receive a same first voltage V1, and the substrates of the transistors MN11 to MN13 receive a same second voltage V2.

In addition, first terminals of the transistors MP11 to MP13 may receive a voltage Vpp, second terminals of the transistors MP11 to MP13 are respectively coupled to first terminals of the transistors MN11 to MN13 and corresponding word lines (e.g., the word line WL), and second terminals of the transistors MN11 to MN13 may receive a reference ground voltage Vss (e.g., equal to 0 volt).

In addition, a plurality of first terminals of the bit line switches BLT1 to BLT3 are respectively coupled to a plurality of bit lines LBL1 to LBL3 on the memory cell block 110. A plurality of second terminals of the bit line switches BLT1 to BLT3 are commonly coupled to a common bit line GBL. A plurality of first terminals of the source line switches SLT1 to SLT3 are respectively coupled to a plurality of source lines LSL1 to LSL3 on the memory cell block 110. A plurality of second terminals of the source line switches SLT1 to SLT3 are commonly coupled to a common source line CSL. In this embodiment, the bit line switches BLT1 to BLT3 are respectively composed of transistors MN21 to MN23, and substrates of the transistors MN21 to MN23 are formed by a P-type well region PWI2. The source line switches SLT1 to SLT3 are respectively composed of transistors MN31 to MN33, and substrates of the transistors MN31 to MN33 are formed by a P-type well region PWI3.

The substrates of the transistors MN21 to MN23 receives a voltage V3 applied to the P-type well region PWI2, and the substrates of the transistors MN31 to MN33 receives a voltage V4 applied to the P-type well region PWI3.

In this embodiment, during a soft program operation (SPGM) and a soft program verify operation (SPV) performed by the memory device 100, the voltages V1, V2, V3, and V4 respectively received by the substrates of the transistors MP11 to MP13, the transistors MN11 to MN13, the transistors MN21 to MN23, and the transistors MN31 to MN33 are maintained at a constant voltage value and are in a state of static voltage.

It is worth noting that, in the structures of the transistors MP11 to MP13, the transistors MN11 to MN13, the transistors MN21 to MN23, and the transistors MN31 to MN33, there are a certain number of parasitic capacitances between the substrates thereof and the adjacent semiconductor materials. Therefore, during a soft program operation and a subsequent soft program verify operation performed by the memory device 100, by making the voltages V1 to V4 received by the transistors MP11 to MP13, the transistors MN11 to MN13, the transistors MN21 to MN23, and the transistors MN31 to MN33 constant static voltages, additional voltage stabilization time required for switching the voltage value of the substrate voltages may be reduced. As a result, the memory device 100 of this embodiment can increase the operation speed of the soft program operation and the subsequent soft program verify operation, and improve work efficiency.

Incidentally, in this embodiment, the memory cell block 110 includes a plurality of memory cells MC. The memory cells MC may be AND flash memory cells or NOR flash memory cells, and may be constructed by three-dimensionally stacking.

Incidentally, in this embodiment, the number of the bit line switches BLT1 to BLT3 and the number of the source line switches SLT1 to SLT3 shown in FIG. 1 only serve for convenience of description. In the actual circuit, the number of bit line switches and the number of source line switches corresponding to a single memory cell block may be determined by the designer, and are no particularly limited.

Figure 2A:
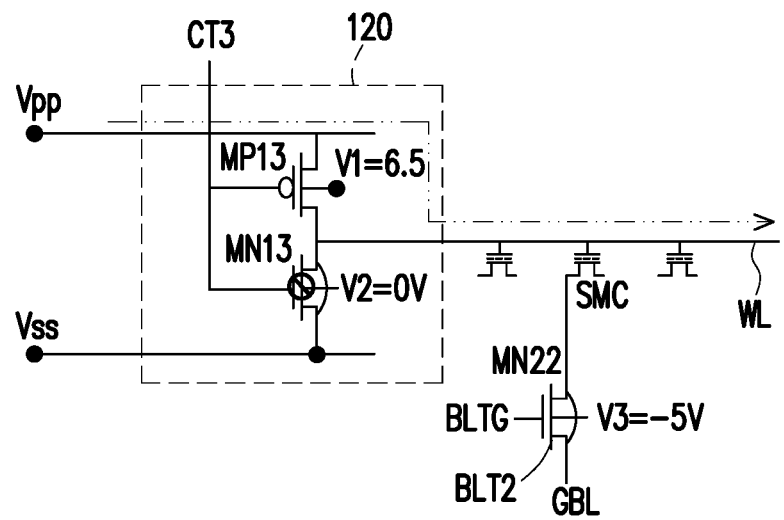
FIG. 2A and FIG. 2B are schematic diagrams of implementations of a soft program operation and a soft program verify operation of a memory device according to an embodiment of the disclosure.
Figure 2B:
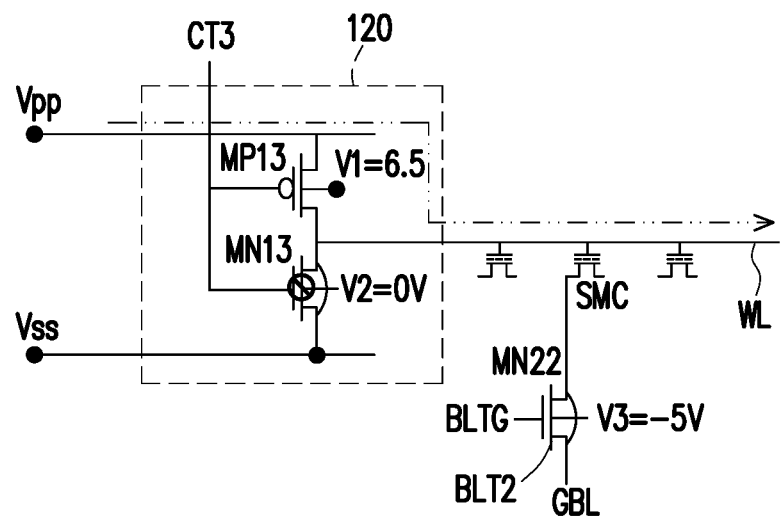

Next, with reference to FIG. 2A and FIG. 2B, FIG. 2A and FIG. 2B are schematic diagrams of implementations of a soft program operation and a soft program verify operation of a memory device according to an embodiment of the disclosure. In FIG. 2A, corresponding to the embodiment of FIG. 1, during a soft program operation of a first type (e.g., making a selected memory cell SMC perform a slight program operation) performed by the memory device 100, the word line driver 120 may turn on the transistor MP13 and turn off the transistor MN13 according to the control signal CT3, and the word line driver 120 may provide the voltage Vpp (which is a program voltage of, for example, 5 volts (V) at this time) to the word line WL corresponding to the selected memory cell SMC. At this time, the voltage V1 received by the substrate of the transistor MP13 is equal to 6.5V, for example, and the voltage V2 received by the substrate of the transistor MN13 is equal to 0V, for example.

In addition, the bit line switch BLT2 corresponding to the selected memory cell SMC may be turned on according to a control signal BLTG. At this time, the control signal BLTG is equal to 6V, for example, and the voltage V3 received by the substrate of the transistor MN22 forming the bit line switch BLT2 is equal to −5V, for example. Moreover, the voltage on the common bit line GBL is −5V, for example.

In FIG. 2B, similarly corresponding to the embodiment of FIG. 1, during a soft program verify operation performed by the memory device 100, the word line driver 120 may turn on the transistor MP13 and turn off the transistor MN13 according to the control signal CT3, and the word line driver 120 may provide the voltage Vpp (which is a verification voltage of, for example, 6.5V at this time) to the word line WL corresponding to the selected memory cell SMC. At this time, the voltage V1 received by the substrate of the transistor MP13 is equal to 6.5V, for example, and the voltage V2 received by the substrate of the transistor MN13 is equal to 0V, for example.

In addition, the bit line switch BLT2 corresponding to the selected memory cell SMC may be turned on according to the control signal BLTG. At this time, the control signal BLTG is equal to 6V, for example, and the voltage V3 received by the substrate of the transistor MN22 forming the bit line switch BLT2 is equal to −5V, for example. Moreover, the voltage on the common bit line GBL is 1.8V, for example.

As can be known from the description above, in FIG. 2A and FIG. 2B, during the soft program operation and the soft program verify operation performed by the memory device 100, the voltages V1, V2, and V3 received by the substrates of the transistors MN13, MP13, and MN22 are static voltages that remain unchanged. As a result, during the soft program operation and the soft program verify operation performed by the memory device 100, additional time to wait for stabilization of the substrate voltages is not required, increasing the operation speed.

Figure 3A:
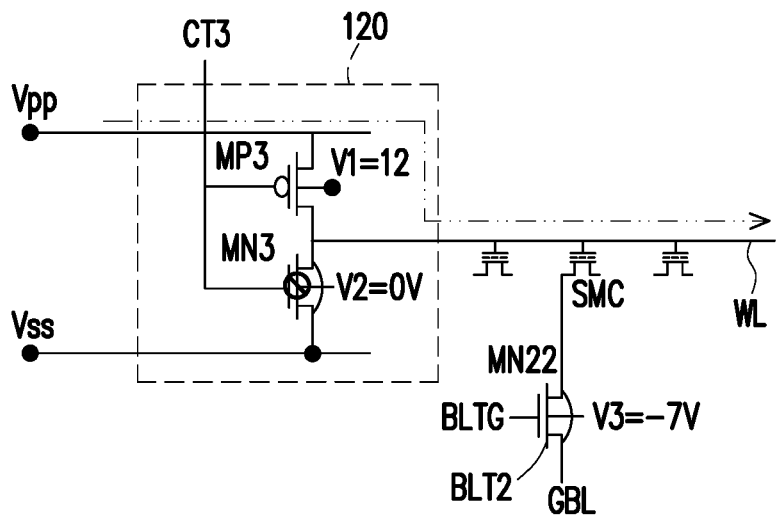
FIG. 3A and FIG. 3B are schematic diagrams of implementations of a soft program operation and a soft program verify operation of a memory device according to another embodiment of the disclosure.
Figure 3B:
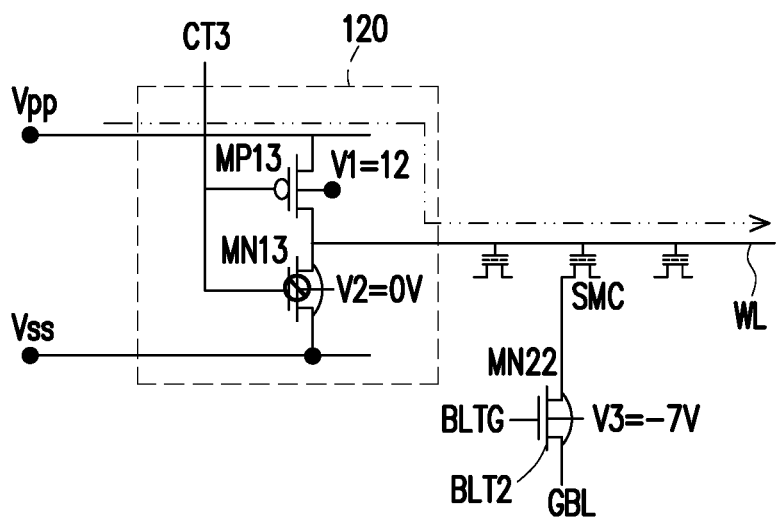

Next, with reference to FIG. 3A and FIG. 3B, FIG. 3A and FIG. 3B are schematic diagrams of implementations of a soft program operation and a soft program verify operation of a memory device according to another embodiment of the disclosure. In FIG. 3A, corresponding to the embodiment of FIG. 1, during a soft program operation of a second type (e.g., making the selected memory cell SMC perform a relatively heavy program operation) performed by the memory device 100, the word line driver 120 may turn on the transistor MP13 and turn off the transistor MN13 according to the control signal CT3, and the word line driver 120 may provide the voltage Vpp (which is a program voltage at this time) to the word line WL corresponding to the selected memory cell SMC. In this embodiment, the memory device 100 may perform the soft program operation through incremental step pulse programming (ISPP), and the voltage Vpp as a program voltage may be incremented from 7V to 12V.

At this time, the voltage V1 received by the substrate of the transistor MP13 is equal to 12V, for example, and the voltage V2 received by the substrate of the transistor MN13 is equal to 0V, for example.

In addition, the bit line switch BLT2 corresponding to the selected memory cell SMC may be turned on according to the control signal BLTG. At this time, the control signal BLTG is equal to 6V, for example, and the voltage V3 received by the substrate of the transistor MN22 forming the bit line switch BLT2 is equal to −7V, for example. Moreover, the voltage on the common bit line GBL is −7V, for example.

In FIG. 3B, similarly corresponding to the embodiment of FIG. 1, during a soft program verify operation performed by the memory device 100, the word line driver 120 may turn on the transistor MP13 and turn off the transistor MN13 according to the control signal CT3, and the word line driver 120 may provide the voltage Vpp (which is a verification voltage of, for example, 6.5V at this time) to the word line WL corresponding to the selected memory cell SMC. At this time, the voltage V1 received by the substrate of the transistor MP13 is equal to 12V, for example, and the voltage V2 received by the substrate of the transistor MN13 is equal to 0V, for example.

In addition, the bit line switch BLT2 corresponding to the selected memory cell SMC may be turned on according to the control signal BLTG. At this time, the control signal BLTG is equal to 6V, for example, and the voltage V3 received by the substrate of the transistor MN22 forming the bit line switch BLT2 is equal to −7V, for example. Moreover, the voltage on the common bit line GBL is 1.8V, for example.

As can be known from the description above, in FIG. 3A and FIG. 3B, similar to the embodiment of FIG. 2A and FIG. 2B, during the soft program operation and the soft program verify operation performed by the memory device 100, the voltages V1, V2, and V3 received by the substrates of the transistors MN13, MP13, and MN22 are static voltages that remain unchanged. As a result, during the soft program operation and the soft program verify operation performed by the memory device 100, additional time to wait for stabilization of the substrate voltages is not required, increasing the operation speed.

It is worth mentioning that, in the embodiments of the disclosure, during a normal data reading operation performed by the memory device, different from the soft program verify operation shown in FIG. 3B, the substrate of the transistor MP13 may receive a voltage of 6.5V, for example, and the substrate of the transistor MN22 forming the bit line switch BLT2 may receive a voltage of 0V, for example. The word line driver 120 may perform the normal data read operation of the selected memory cell SMC under the circumstances that the voltage on the common bit line GBL is 1.8V by providing a word line signal of 6.5V, for example.

Figure 4:
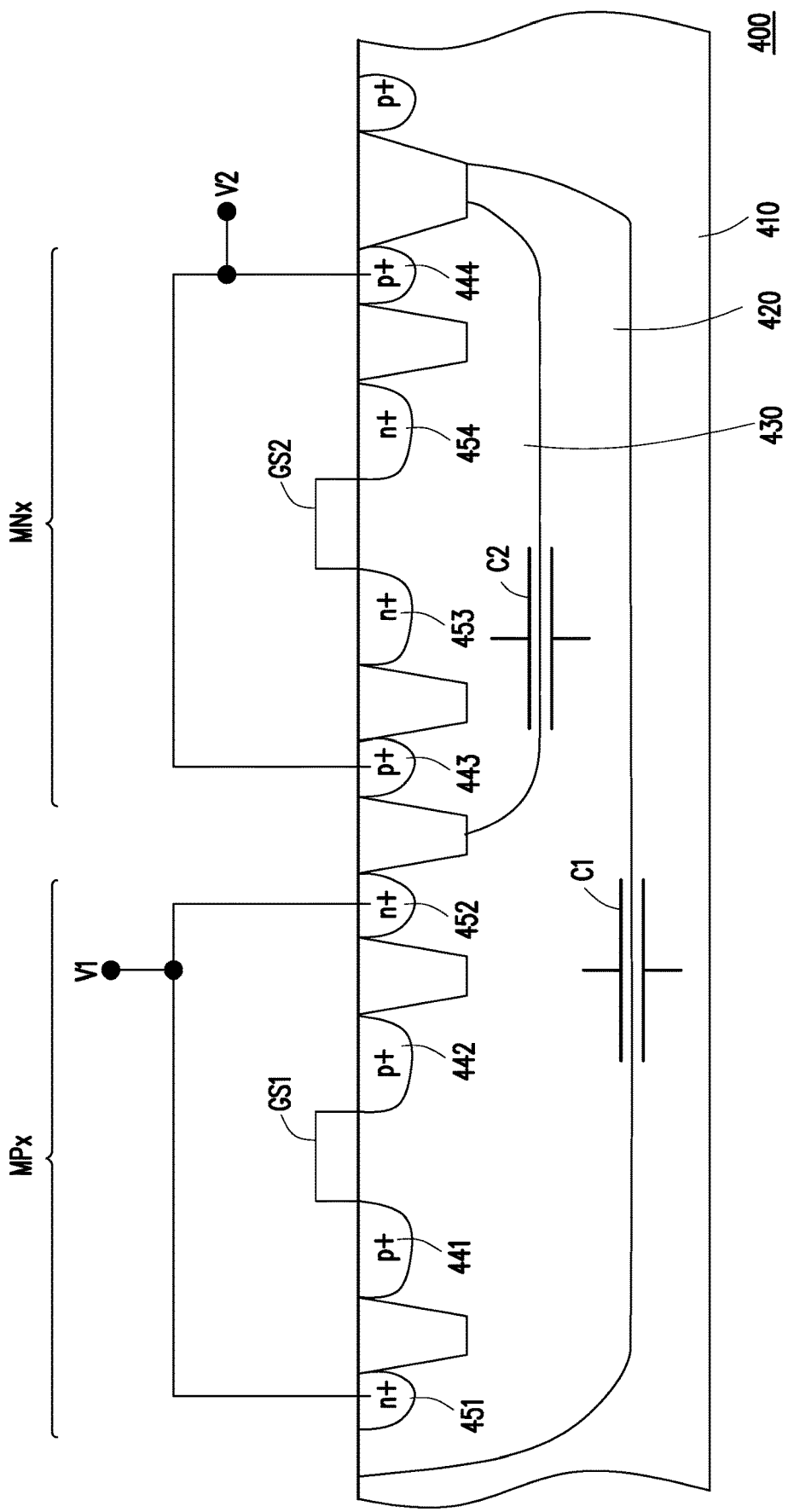
FIG. 4 is a schematic cross-sectional structural view of a word line driver in a memory device according to an embodiment of the disclosure.

Next, with reference to FIG. 4, FIG. 4 is a schematic cross-sectional structural view of a word line driver in a memory device according to an embodiment of the disclosure. FIG. 4 is a cross-sectional structural view of a complementary transistor pair in a word line driver. The word line driver is disposed on an integrated circuit 400. The integrated circuit 400 has a substrate 410, well regions 420 and 430, P-type heavily-doped regions (p+) 441 to 444, N-type heavily-doped regions (n+) 451 to 454, and gate structures GS1 and GS2. The well region 420 is formed on the substrate 410. The well region 430 is formed on the well region 420. The P-type heavily-doped regions (p+) 441 and 442 and the N-type heavily-doped regions (n+) 451 and 452 are formed in the well region 420. The P-type heavily-doped regions (p+) 443 and 444 and the N-type heavily-doped regions (n+) 453 and 454 are formed in the well region 430. The gate structure GS1 covers the well region 420 and is disposed on the region between the P-type heavily-doped regions (p+) 441 and 442. The gate structure GS1, the P-type heavily-doped regions (p+) 441 and 442, the N-type heavily-doped regions (n+) 451 and 452, and the well region 420 form a transistor MPx. The gate structure GS2 covers the well region 430 and is disposed on the region between the N-type heavily-doped regions (n+) 453 and 454. The gate structure GS2, the N-type heavily-doped regions (n+) 453 and 454, the P-type heavily-doped regions (p+) 443 and 444, and the well region 430 form a transistor MNx.

In this embodiment, the N-type heavily-doped regions (n+) 451 and 452 may be coupled to each other and form a potential pickup point so that the well region 420 may receive the voltage V1. The well region 420 may serve as a substrate of the transistor MPx. In addition, the P-type heavily-doped regions (p+) 443 and 444 may be coupled to each other and form a potential pickup point so that the well region 430 may receive the voltage V2. The well region 430 may serve as a substrate of the transistor MNx.

The transistor MPx in this embodiment may be configured to implement any one of the transistors MP11 to MP13 in the embodiment of FIG. 1, and the transistor MNx may be configured to implement any one of the transistors MN11 to MN13 in the embodiment of FIG. 1.

Incidentally, in the integrated circuit 400, there may be a parasitic capacitance C1 between the well region 420 and the substrate 410, and a parasitic capacitance C2 between the well region 420 and the well region 430. In this embodiment, during a soft program operation and a soft program verify operation performed by the memory device, by making the voltages V1 and V2 received by the well regions 420 and 430 constant static voltages, it is possible to prevent charging and discharging on the capacitances C1 and C2, which not only reduces unnecessary power consumption, but also effectively increases the speed of performing the soft program operation and the soft program verify operation, improving work efficiency of the memory device.

Incidentally, in this embodiment, the substrate 410 is a P-type substrate, and the well regions 420 and 430 are respectively an N-type well region and a P-type well region having complementary conductive polarities.

Figure 5:
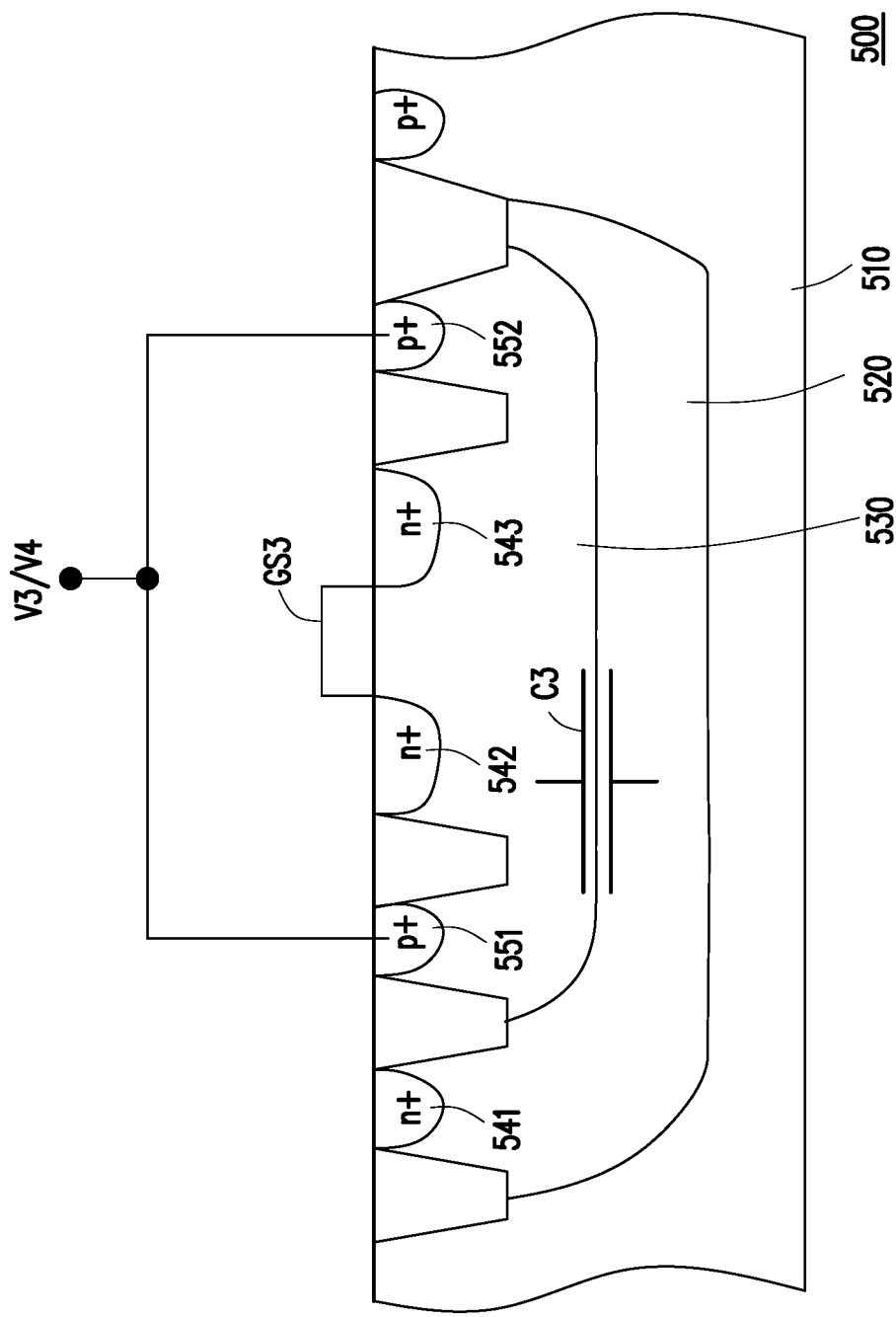
FIG. 5 is a schematic cross-sectional structural view of a bit line switch or a source line switch in a memory device according to an embodiment of the disclosure.

Next, with reference to FIG. 5, FIG. 5 is a schematic cross-sectional structural view of a bit line switch or a source line switch in a memory device according to an embodiment of the disclosure. The structure shown in FIG. 5 may be configured to implement a bit line switch or a source line switch. The bit line switch or the source line switch may be disposed in an integrated circuit 500. The integrated circuit 500 includes a substrate 510, well regions 520 and 530, N-type heavily-doped regions (n+) 541, 542, and 543, P-type heavily-doped regions (p+) 551 and 552, and a gate structure GS3. The well region 520 is formed on the substrate 510. The well region 530 is formed on the well region 520. The substrate 510 may be a P-type substrate. The well region 530 and the well region 520 have complementary conductive polarities. The well region 530 may be a P-type well region. The well region 520 may be an N-type well region.

The N-type heavily-doped region (n+) 541 may be formed in the well region 520. The N-type heavily-doped regions (n+) 542 and 543 may be formed in the well region 530. The P-type heavily-doped regions (p+) 551 and 552 may be formed in the well region 530 and respectively located on two sides of the N-type heavily-doped regions (n+) 542 and 543. The gate structure GS3 covers the well region 530 and is disposed on the region between the N-type heavily-doped regions (n+) 542 and 543.

Here, the gate structure GS3, the N-type heavily-doped regions (n+) 542 and 543, the P-type heavily-doped regions (p+) 551 and 552, and the well region 530 may form a transistor for constructing a bit line switch or a source line switch.

It is worth noting that the P-type heavily-doped regions (p+) 551 and 552 may be coupled to each other and form a potential pickup point so that the well region 530 may receive the voltage V3 or V4. The well region 530 may form a substrate of a transistor implementing a bit line switch or a source line switch.

Incidentally, in the integrated circuit 500, there may be a parasitic capacitance C3 between the well region 520 and the well region 530. In this embodiment, during a soft program operation and a soft program verify operation performed by the memory device, by making the voltage V3 or V4 received by the well region 530 a constant static voltage, it is possible to prevent charging and discharging on the capacitance C3, which not only reduces unnecessary power consumption, but also effectively increases the speed of performing the soft program operation and the soft program verify operation, improving work efficiency of the memory device.

With reference to FIG. 6A to FIG. 6E, FIG. 6A to FIG. 6E are schematic circuit operation diagrams of a soft program operation of a memory device according to an embodiment of the disclosure. A memory device 600 includes a memory cell block 610, a bit line driver 620, the bit line switches BL11 to BLT3, the source line switches SLT1 to SLT3, a sensing amplifier SA, a page buffer PB, an input/output circuit 630, and address decoders CDEC1, CDEC2, and RDEC. The source line switches SLT1 to SLT3 are coupled between the common source line CSL and the memory cell block 610. The bit line switches BL11 to BLT3 are coupled between the memory cell block 610 and the common bit line GBL.

Figure 6A:
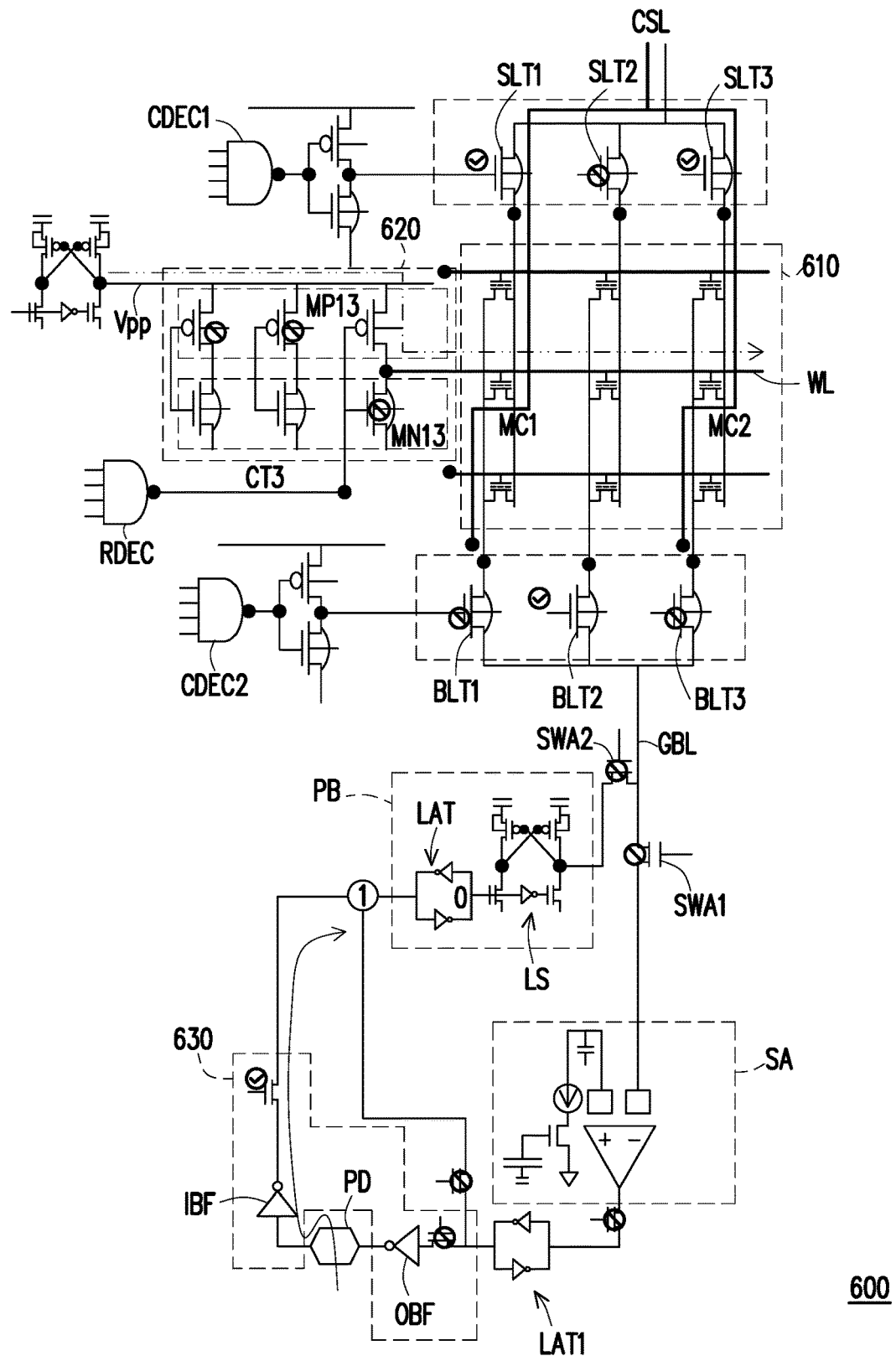
FIG. 6A to FIG. 6E are schematic circuit operation diagrams of a soft program operation of a memory device according to an embodiment of the disclosure.

In FIG. 6A, the memory device 600 may first perform a write operation of a digital value. The digital value (which is logic 1) may be received through a pad PD and sent to the page buffer PB through an input buffer IBF in the input/output circuit 630. The page buffer PB includes a latch LAT and a level shifter LS. The digital value sent from the input buffer IBF may be stored in the latch LAT. At this time, the coupling path between an output buffer OBF in the input/output circuit 630 and the sensing amplifier SA is cut off.

At this time, switches SWA1 and SWA2 coupled between the common bit line GBL, the sensing amplifier SA, and the page buffer PB are turned off. In addition, the address decoder CDEC1 provides a signal to turn on the source line switches SLT1 and SLT3 and turn off the source line switch SLT2. The address decoder CDEC2 provides a signal to turn on the bit line switch BLT2 and turn off the bit line switches BLT1 and BLT3. In a word line driver 620, the address decoder RDEC provides the control signal CT3 to turn on the transistor MP13 and turn off the transistor MN13. The word line driver 620 may provide the word line WL with a word line signal equal to the voltage Vpp (which is, for example, 7V). The common source line CSL is 2V, for example. As a result, memory cells MC1 and MC2 may be inhibited.

Figure 6B:
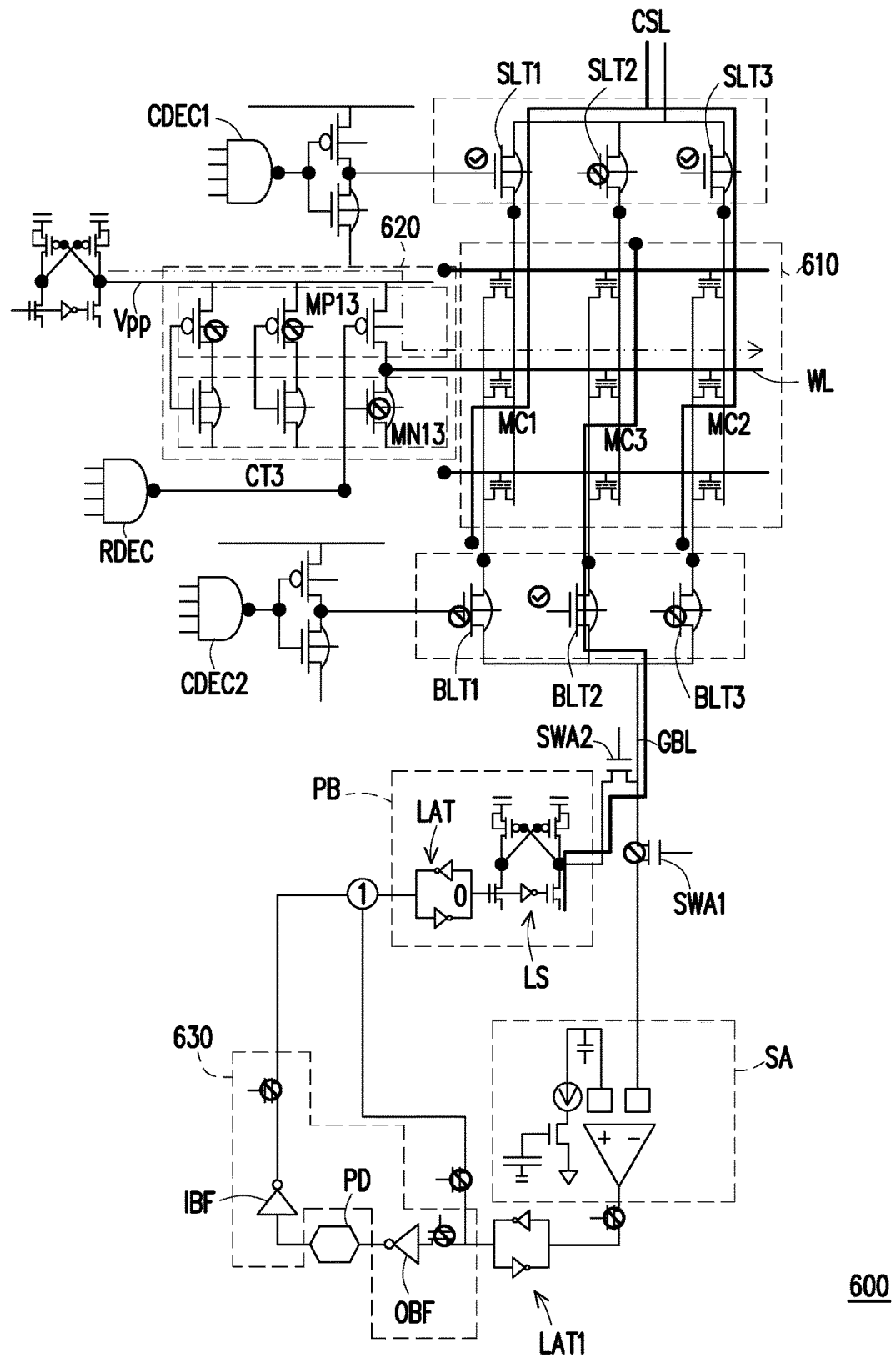

In FIG. 6B, the memory device 600 may determine whether to perform a soft program operation. At this time, the address decoder CDEC1 provides a signal to turn on the source line switches SLT1 and SLT3 and turn off the source line switch SLT2. The address decoder CDEC2 provides a signal to turn on the bit line switch BLT2 and turn off the bit line switches BLT1 and BLT3. The word line driver 620 may provide the word line WL with a word line signal equal to the voltage Vpp (which is a program voltage of, for example, 7V). Correspondingly, the memory cells MC1 and MC2 are inhibited, and a memory cell MC3 is the selected memory cell.

In addition, the switch SWA2 is turned on at this time, and the common bit line GBL may be coupled to the page buffer PB through the switch SWA2. In the page buffer PB, by shifting a voltage of a digital value (e.g., logic 1) opposite to the digital value stored in the latch LAT, the level shifter LS may amplify the digital value to generate a bias voltage, and provide the bias voltage to the common bit line GBL. In this embodiment, the page buffer PB provides a bias voltage of, for example, −7V to the common bit line GBL. As a result, the memory cell MC3 as the selected memory cell may perform the soft program operation.

It is worth mentioning that, in this embodiment, whether the selected memory cell in the memory device 600 performs the soft program operation may be determined according to the voltage on the common bit line GBL. If the digital value stored in the latch LAT in the page buffer PB is logic 0, the level shifter LS may generate a bias voltage equal to, for example, 2V according to a digital value of logic 1, and provide the bias voltage to the common bit line GBL. As a result, the memory cell MC3 is inhibited, and the soft program operation for the memory cell MC3 is not be performed.

Figure 6C:
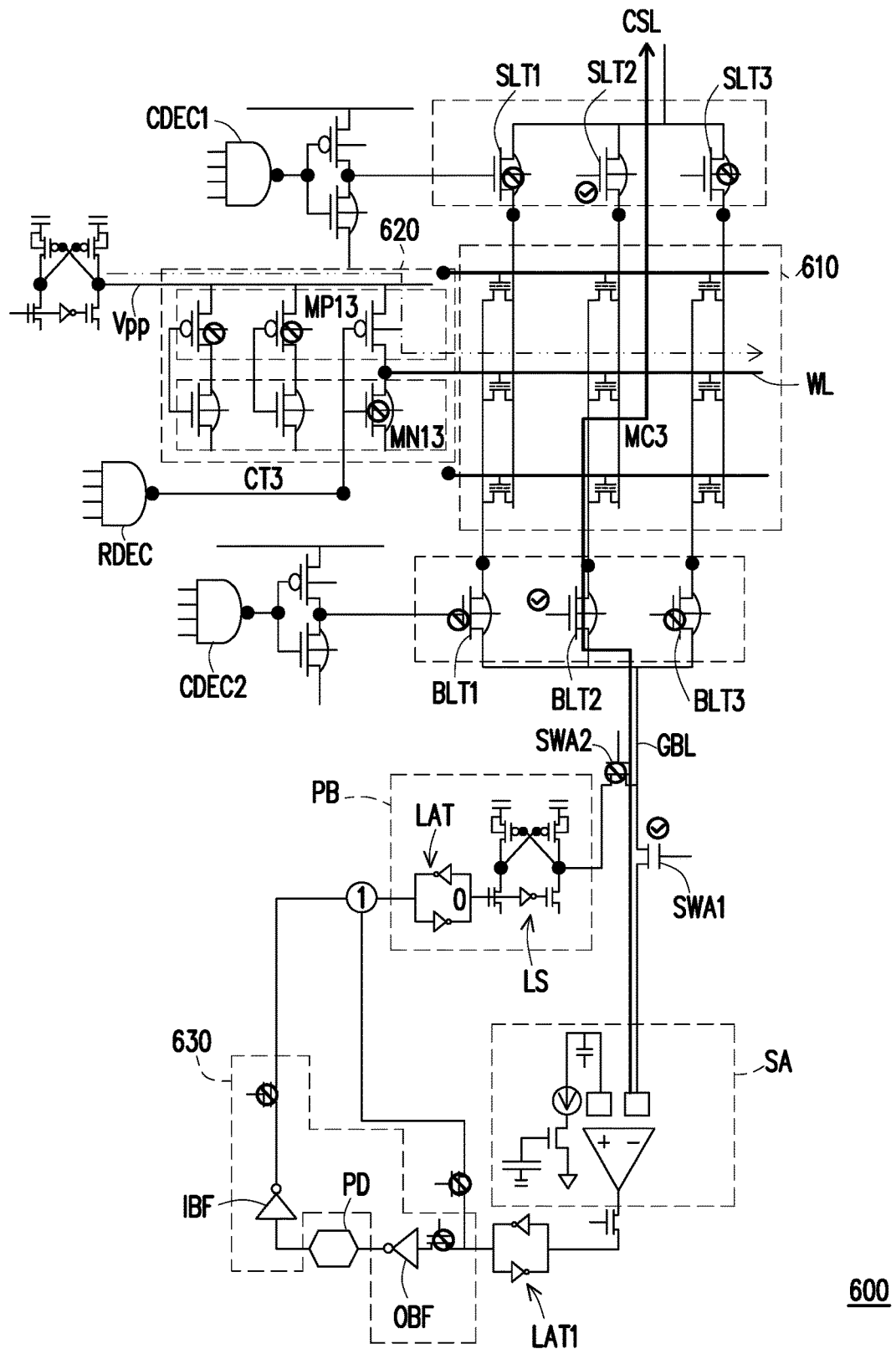

In FIG. 6C, after the soft program operation is completed, the memory device 600 may perform a soft program verify operation. During the soft program verify operation, the switch SWA1 is turned on (the switch SWA2 is turned off), and the sensing amplifier SA may be coupled to the common bit line GBL. Meanwhile, the address decoder CDEC1 provides a signal to turn on the source line switch SLT2 and turn off the source line switches SLT1 and SLT3. The address decoder CDEC2 provides a signal to turn on the bit line switch BLT2 and turn off the bit line switches BLT1 and BLT3. The word line driver 620 may provide the word line WL with a word line signal equal to the voltage Vpp (which is a read voltage of, for example, 6.5V). Correspondingly, the memory cell MC3 is the selected memory cell.

The memory cell MC3 may provide a sensing current to the sensing amplifier SA through the common bit line GBL. The sensing amplifier SA may compare the sensing current provided by the memory cell MC3 according to a predetermined reference current to generate a sensing result. The sensing amplifier SA may temporarily store the sensing result in the latch LAT1.

In this embodiment, when the critical voltage of the memory cell MC3 is less than a target value, the sensing current provided by the memory cell MC3 may be greater than the reference current on the sensing amplifier SA, so that the sensing amplifier SA generates a sensing result equal to logic 0. Comparatively, when the critical voltage of the memory cell MC3 is not less than the target value, the sensing current provided by the memory cell MC3 may be not greater than the reference current on the sensing amplifier SA, so that the sensing amplifier SA generates a sensing result equal to logic 1. Here, the sensing result equal to logic 0 indicates that the soft program operation for the memory cell MC3 has not been completed, and the sensing result equal to logic 1 indicates that the soft program operation for the memory cell MC3 has been completed.

It is worth mentioning that, during the soft program operation and the soft program verify operation of FIG. 6B and FIG. 6C, the voltages received by the substrates of the word line driver 620, the bit line switches BLT1 to BLT3, and the source line switches SLT1 to SLT3 are constant static voltages.

Further, during the soft program operation and the soft program verify operation of FIG. 6B and FIG. 6C, the voltages received by the substrates of the transistors in the address decoders CDEC1, CDEC2, and RDEC and in the corresponding drivers may also be constant static voltages.

Figure 6D:
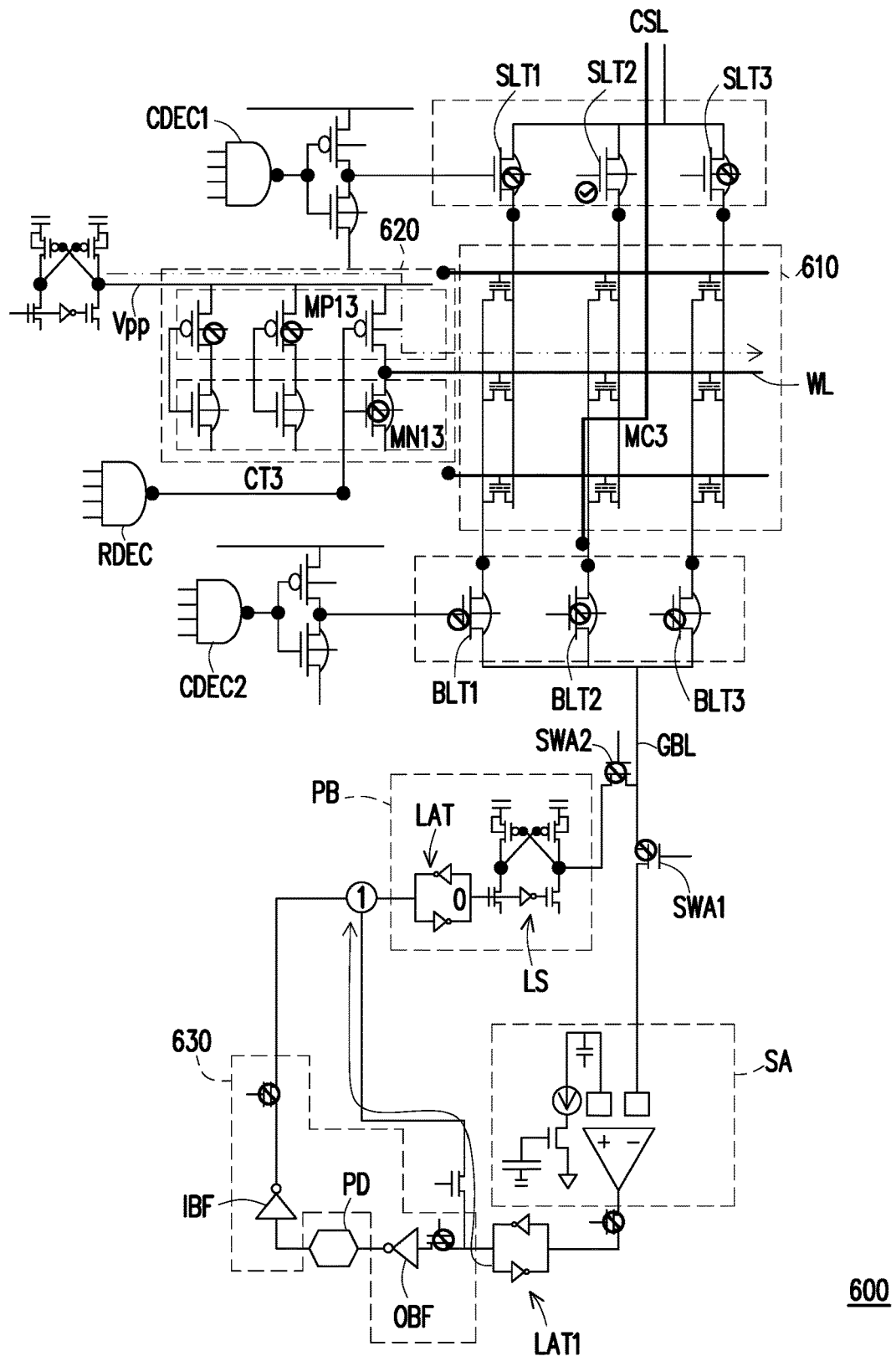
Figure 6E:
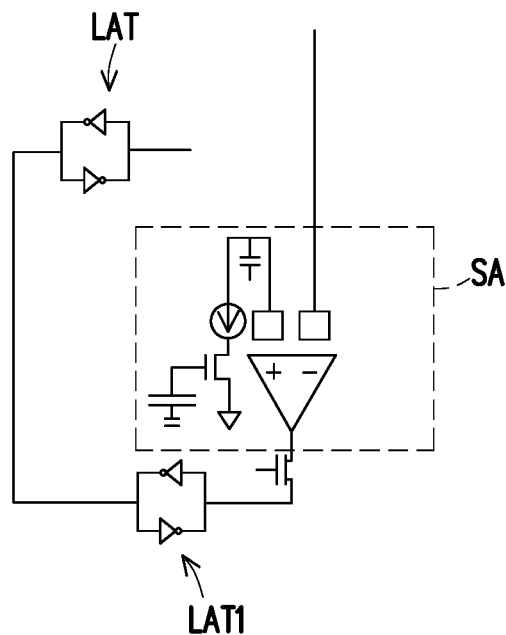

In FIG. 6D, the memory device 600 performs an operation to write the sensing result of the sensing amplifier SA to the page buffer PB. At this time, a switch SWA3 coupled between the latch LAT1 and the page buffer PB is turned on. An inversion of the sensing result stored in the latch LAT1 may be written into the latch LAT in the page buffer PB. When the sensing result stored in the latch LAT1 is equal to logic 0, the latch LAT1 provides the inversion of the sensing result equal to logic 1 to be written to the latch LAT. This operation does not change the data in the latch LAT. Therefore, the soft program operation for the memory cell MC3 may continue to be performed. Comparatively, with reference to FIG. 6E, when the sensing result stored in the latch LAT1 is equal to logic 1, the latch LAT1 provides the inversion of the sensing result equal to logic 0 to be written to the latch LAT, and rewrites the digital value stored in the latch LAT to logic 0. As a result, the soft program operation performed for the memory cell MC3 may be ceased.

It is worth mentioning that, when the soft program operation for the memory cell MC3 is determined to be continued, the operation procedure may return to the implementation of FIG. 6B of the disclosure to perform the next soft program operation for the memory cell MC3. It is worth noting that, as the number of soft program operations increases, the program voltage provided by the word line driver 620 to the word line WL may be incremented according to a step size. Specifically, the voltage Vpp as the program voltage may be equal to the initial program voltage (e.g., 7V) added with n times the step size, where n is the number of times of performing the soft program operation minus 1, and the step size may be a voltage value predetermined by the designer.

By repeating the circuit operations of FIG. 6B to FIG. 6D, the memory device 600 may complete the soft program operation of the memory cells in the memory cell block 610.

Figure 7:
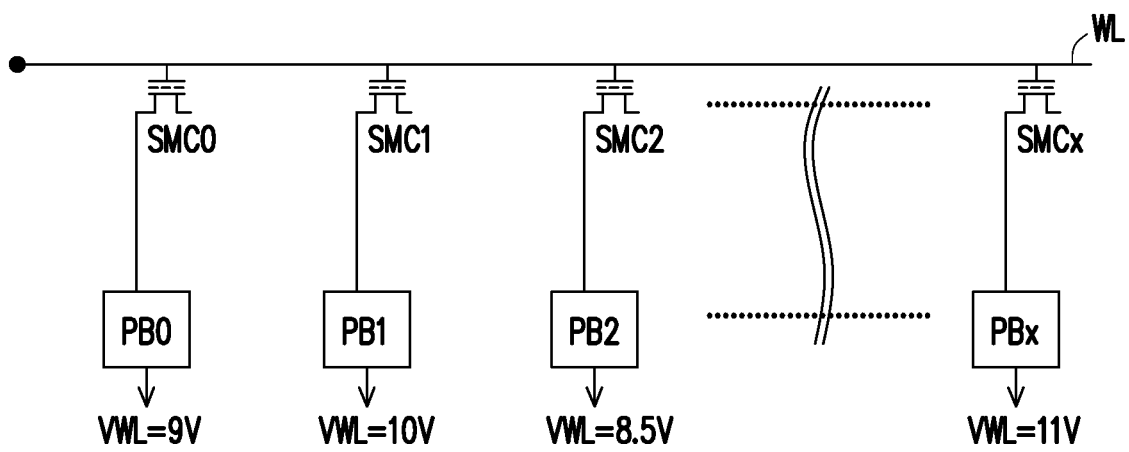
FIG. 7 is a schematic diagram illustrating a plurality of selected memory cells in a memory device performing a soft program operation according to an embodiment of the disclosure.

Next, with reference to FIG. 7, FIG. 7 is a schematic diagram illustrating a plurality of selected memory cells in a memory device performing a soft program operation according to an embodiment of the disclosure. In this embodiment, a plurality of selected memory cells SMC0 to SMCx on the same word line WL may commonly perform a soft program operation. The selected memory cells SMC0 to SMCx may be respectively coupled to a plurality of page buffers PB0 to PBx. Through the implementation of FIG. 6A to FIG. 6E, the plurality of selected memory cells SMC0 to SMCx may perform a soft program operation respectively according to digital values recorded by the page buffers PB0 to PBx. During the soft program operation, a word line voltage VWL of a power line signal on the word line WL may be gradually incremented through incremental step pulse programming (ISPP). Each of the selected memory cells SMC0 to SMCx may complete the soft program operation under different word line voltages VWL. For example, the selected memory cell SMC0 may complete the soft program operation when the word line voltage VWL=9V; the selected memory cell SMC1 may complete the soft program operation when the word line voltage VWL=10V; the selected memory cell SMC2 may complete the soft program operation when the word line voltage VWL=8.5V; . . . ; the selected memory cell SMCx may complete the soft program operation when the word line voltage VWL=11V. In other words, the plurality of selected memory cells SMC0 to SMCx may complete the soft program operation through one incremental process of the word line voltage VWL of the power line signal on the word line WL.

Figure 8A:
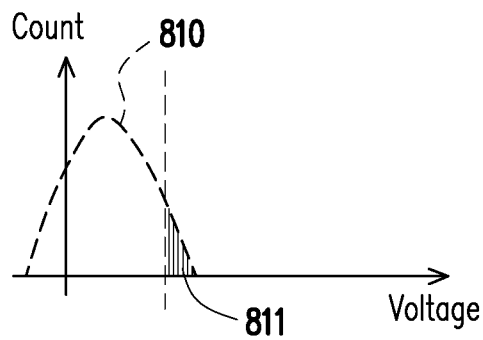
FIG. 8A to FIG. 8C are schematic diagrams illustrating changes in critical voltage distribution of memory cells performing a soft program operation during an erasing process of a memory device according to an embodiment of the disclosure.
Figure 8B:
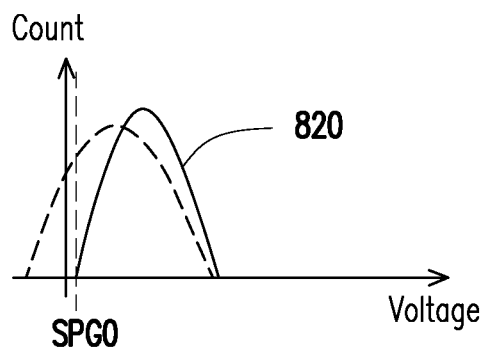
Figure 8C:
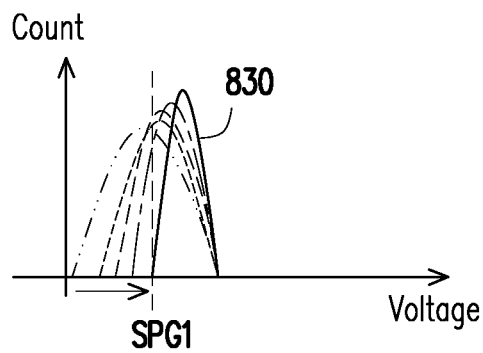

Next, with reference to FIG. 8A to FIG. 8C, FIG. 8A to FIG. 8C are schematic diagrams illustrating changes in critical voltage distribution of memory cells performing a soft program operation during an erasing process of a memory device according to an embodiment of the disclosure. In FIG. 8A, after the memory cell block in the memory device completes block erasing, a count distribution curve 810 of the critical voltage of the memory cells may be obtained. According to the distribution curve 810, the memory device may determine certain memory cells 811 having a relatively high threshold voltage, and inhibit the memory cells 811 from performing the soft program operation. Next, the memory device may perform a first-stage soft program operation for the remaining memory cells to obtain a count distribution curve 820 of the critical voltage of the memory cells of FIG. 8B.

In FIG. 8B, the memory device may perform the first-stage soft program operation according to a target voltage SPG0 so that the distribution curve 820 may be evenly distributed at positions greater than the target voltage SPG0, so as to tighten the distribution range of the distribution curve 820.

Next, the memory device may perform a second-stage soft program operation for the memory cell block, and perform a further soft program operation according to another target voltage SPG1 greater than the target voltage SPG0, so that a count distribution curve 830 of the critical voltage of the memory cells may be further tightened.

In this embodiment, the second-stage soft program operation may be completed through incremental step pulse programming (ISPP).

Figure 9:
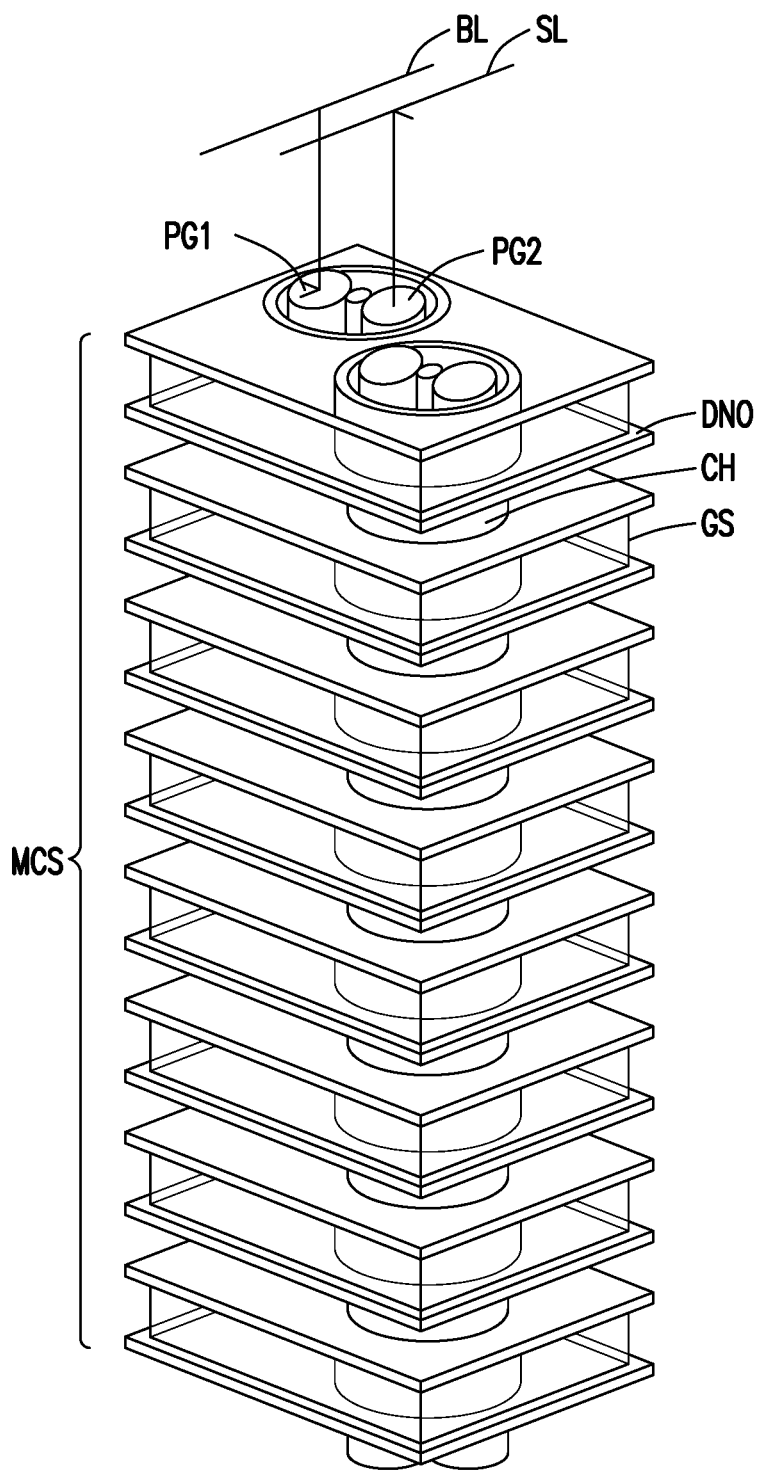
FIG. 9 is a schematic structural view of memory cells of a memory device according to an embodiment of the disclosure.

Next, with reference to FIG. 9, FIG. 9 is a schematic structural view of memory cells of a memory device according to an embodiment of the disclosure. In the memory device of an embodiment of the disclosure, a plurality of memory cells MCs in the memory cell block may be constructed by stacking and form a memory cell string with a three-dimensional structure. Each memory cell may have a silicon oxide-silicon nitride-silicon oxide layer ONO as an insulating layer, and has a channel structure CH and a gate structure GS. A local bit line BL and a local source line SL are respectively connected to all the memory cell MCs in the memory cell string through conductive pins PG1 and PG2.

In this embodiment, the memory cells MCs may be NOR (NOR) flash memory cells, or AND (AND) flash memory cells.

In summary of the foregoing, in the embodiments of the disclosure, during the process of the soft program operation and the soft program verify operation performed by the memory device, the voltages received by the substrates of the transistors in the first-stage decoder (including the bit line switch and the word line driver) may be maintained to be constant static voltages. As a result, during the process of the soft program operation and the soft program verify operation performed by the memory device, without time required for voltage stabilization due to repeatedly switching the substrate voltages of the transistors, it is possible to speed up the procedures, reduce unnecessary power waste, and effectively improve work efficiency of the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device comprising:
   a memory cell block;
   a word line driver having a plurality of complementary transistor pairs for respectively generating a plurality of word line signals for a plurality of word lines of the memory cell block, wherein substrates of a first transistor and a second transistor of each of the complementary transistor pairs respectively receive a first voltage and a second voltage; and
   a plurality of bit line switches respectively coupled to a plurality of bit lines of the memory cell block, wherein each of the bit line switches comprises a third transistor, and a substrate of the third transistor receives a third voltage,
   wherein the first voltage, the second voltage, and the third voltage are maintained to be constant static voltages during a soft program operation and a soft program verify operation performed by the memory cell block.

2. The memory device according to claim 1, comprising:
   a plurality of source line switches respectively coupled to a plurality of source lines of the memory cell block, wherein each of the source line switches comprises a fourth transistor, a substrate of the fourth transistor receives a fourth voltage, and the fourth voltage is maintained to be a constant static voltage during the soft program operation and the soft program verify operation performed by the memory cell block.

3. The memory device according to claim 1, wherein in each of the complementary transistor pairs, a first terminal of the first transistor receives a program voltage, a second terminal of the first transistor is coupled to a first terminal of the second transistor and a corresponding word line, a second terminal of the second transistor receives a reference ground voltage, and the first transistor and the second transistor are controlled by a control signal.

4. The memory device according to claim 3, wherein the first transistor and the second transistor corresponding to a selected word line are alternately turned on and turned off according to the control signal during the soft program operation to provide a word line signal as a pulse signal to the selected word line.

5. The memory device according to claim 3, further comprising an address decoder coupled to the word line driver for generating the control signal.

6. The memory device according to claim 1, wherein the substrate of the first transistor is formed in a first well region, the substrate of the second transistor is formed in a second well region, and the first well region and the second well region have complementary conductive polarities.

7. The memory device according to claim 6, wherein the first well region is formed in a substrate, and the second well region is formed in the first well region.

8. The memory device according to claim 5, wherein the substrate of the third transistor is formed in a third well region, the third well region has a conductive polarity being the same as a conductive polarity of the second well region, and the third well region is formed in a substrate.

9. The memory device according to claim 1, further comprising:
   a sensing amplifier coupled to a common bit line, the common bit line coupled to the bit line switches;
   an input/output circuit coupled to an output terminal of the sensing amplifier; and
   a page buffer coupled between the input/output circuit and the common bit line.

10. The memory device according to claim 9, wherein the page buffer is configured to store a digital value, amplify the digital value to generate a bias voltage, and transmit the bias voltage to the common bit line, and the memory device determines whether to perform the soft program operation for a selected memory cell according to the bias voltage, wherein the source line switch corresponding to the selected memory cell is turned off, and each of the bit line switches corresponding to the selected memory cell is turned on.

11. The memory device according to claim 10, wherein the source line switch and each of the bit line switches corresponding to the selected memory cell are turned on and the selected memory cell provides a sensing current to the sensing amplifier during the soft program verify operation.

12. The memory device according to claim 11, wherein the sensing amplifier rewrites the digital value in the page buffer through the input/output circuit when the sensing amplifier determines that the soft program verify operation is passed.

13. The memory device according to claim 10, wherein the page buffer comprises:
   a latch for storing the digital value; and
   a level shifter coupled between the latch and the common bit line for amplifying the digital value to generate the bias voltage by shifting an output voltage of the latch.

14. The memory device according to claim 10, wherein the input/output circuit is coupled to a pad, and the input/output circuit comprises:
   an output buffer coupled between an output terminal of the sensing amplifier and the pad; and
   an input buffer coupled between the pad and the page buffer.

15. The memory device according to claim 1, wherein during the soft program operation, the word line driver gradually increases a voltage of each of the word line signals corresponding to a selected memory cell.

16. The memory device according to claim 1, wherein the memory cell block comprises a plurality of AND flash memory cells stacked three-dimensionally, or comprises a plurality of NOR flash memory cells stacked three-dimensionally.

* * * * *